(12) United States Patent
Chen et al.

(10) Patent No.: US 10,232,613 B2
(45) Date of Patent: Mar. 19, 2019

(54) ATOMIC LAYER DEPOSITION PASSIVATION FOR VIA

(71) Applicant: HEWLETT-PACKARD DEVELOPMENT COMPANY, L.P., Houston, TX (US)

(72) Inventors: Zhizhang Chen, Corvallis, OR (US); Mohammed Saad Shaarawi, Corvallis, OR (US); Roberto A Pugliese, Jr., Tangent, OR (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 15/544,048

(22) PCT Filed: Jan. 30, 2015

(86) PCT No.: PCT/US2015/013745
§ 371 (c)(1),
(2) Date: Jul. 17, 2017

(87) PCT Pub. No.: WO2016/122584
PCT Pub. Date: Aug. 4, 2016

(65) Prior Publication Data
US 2017/0368823 A1 Dec. 28, 2017

(51) Int. Cl.
*H01L 23/52* (2006.01)
*B41J 2/14* (2006.01)
*C23C 16/04* (2006.01)
*C23C 16/455* (2006.01)
(Continued)

(52) U.S. Cl.
CPC ......... *B41J 2/14129* (2013.01); *B41J 2/1603* (2013.01); *B41J 2/1628* (2013.01); *B41J 2/1629* (2013.01); *B41J 2/1631* (2013.01); *B41J 2/1642* (2013.01); *B41J 2/1645* (2013.01); *B41J 2/1646* (2013.01); *C23C 16/045* (2013.01);
(Continued)

(58) Field of Classification Search
CPC .................................................. H01L 21/288
See application file for complete search history.

(56) References Cited

U.S. PATENT DOCUMENTS

| 7,025,894 B2 | 4/2006 | Hess et al. |
| 7,517,060 B2 | 4/2009 | Hess |
| 8,106,513 B2 | 1/2012 | Gambino |

(Continued)

OTHER PUBLICATIONS

Pyun, J.W. May 2007. University of TX. Scaling and Process Effect on Electromigration Reliability for Cu/low k Interconnects.

*Primary Examiner* — Thao P Le
(74) *Attorney, Agent, or Firm* — HP Inc.—Patent Department

(57) ABSTRACT

In one example, a liquid ejection device. The device includes a first metal layer over a substrate, a dielectric layer over the first metal layer, and an orifice through the dielectric layer to the first metal layer. The device also includes a second metal layer over the dielectric layer and partially filling the orifice to form a via to electrical connect the two metal layers. The via has a depth-to-width ratio of at least 0.4. The device further includes a passivation stack covering the second metal layer including all interior surfaces of the via. The stack includes an ALD-deposited layer formed by atomic layer deposition.

20 Claims, 6 Drawing Sheets

(51) Int. Cl.
  *H01L 21/768*  (2006.01)
  *B41J 2/16*  (2006.01)
(52) U.S. Cl.
  CPC .. *C23C 16/45525* (2013.01); *H01L 21/76832* (2013.01); *H01L 21/76834* (2013.01)

(56) References Cited

U.S. PATENT DOCUMENTS

| | | |
|---|---|---|
| 8,141,986 B2 | 3/2012 | Chung |
| 8,333,459 B2 | 12/2012 | Rivas |
| 8,727,499 B2 | 5/2014 | Pugliese |
| 2002/0122097 A1 | 9/2002 | Beerling et al. |
| 2003/0035027 A1 | 2/2003 | Vander Plas |
| 2004/0023461 A1 | 2/2004 | Ahn et al. |
| 2004/0087126 A1 | 5/2004 | Fartash et al. |
| 2005/0012791 A1 | 1/2005 | Anderson et al. |
| 2006/0040490 A1 | 2/2006 | Chen |
| 2006/0057839 A1* | 3/2006 | Wang .................. C23C 18/1619 438/629 |
| 2006/0221137 A1* | 10/2006 | Silverbrook ........... B41J 2/1412 347/56 |
| 2006/0238576 A1 | 10/2006 | Lee et al. |
| 2006/0249849 A1* | 11/2006 | Cohen ................ H01L 21/76834 257/758 |
| 2008/0073026 A1* | 3/2008 | Yoshida ................ H05K 3/3484 156/273.3 |
| 2008/0122078 A1 | 5/2008 | He |
| 2011/0059558 A1 | 3/2011 | Takeuchi et al. |
| 2012/0293587 A1 | 11/2012 | Bakker et al. |
| 2013/0063525 A1 | 3/2013 | Sieber |
| 2014/0144681 A1 | 5/2014 | Pushparaj et al. |

* cited by examiner

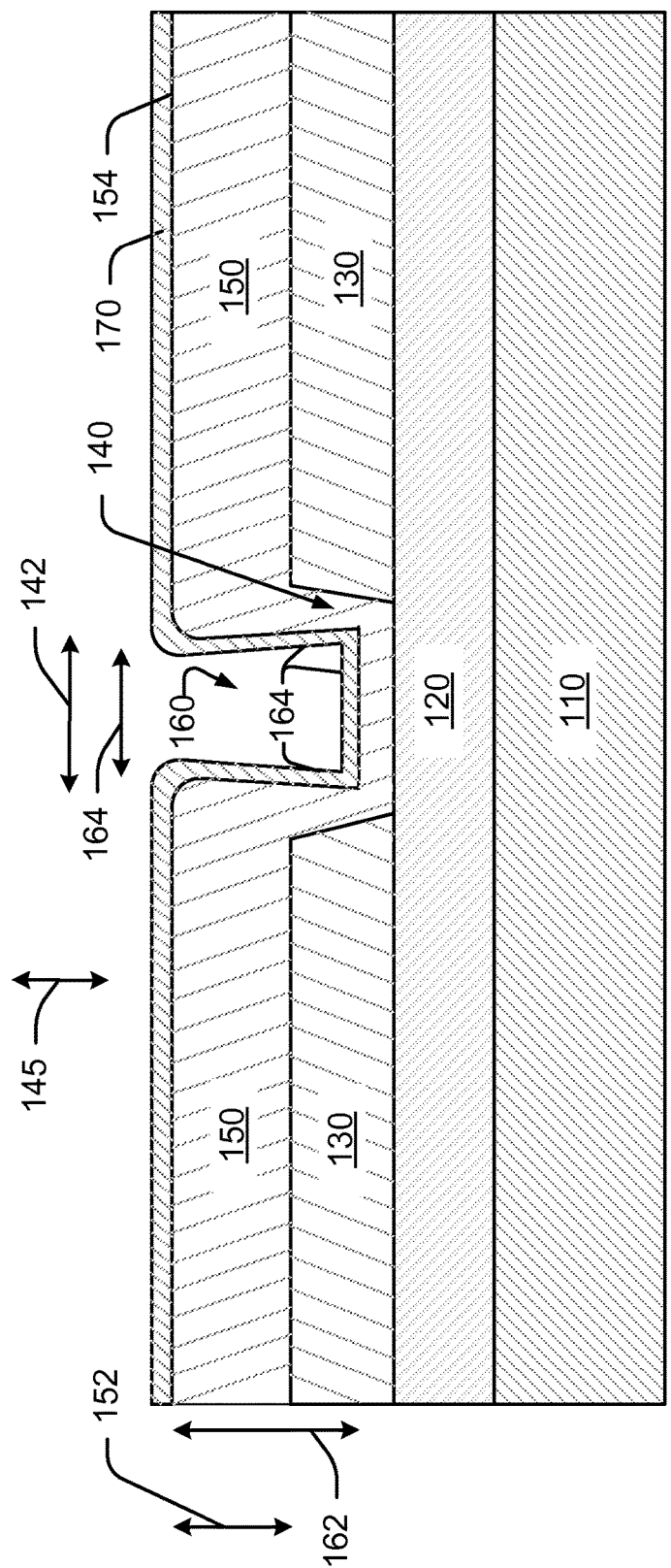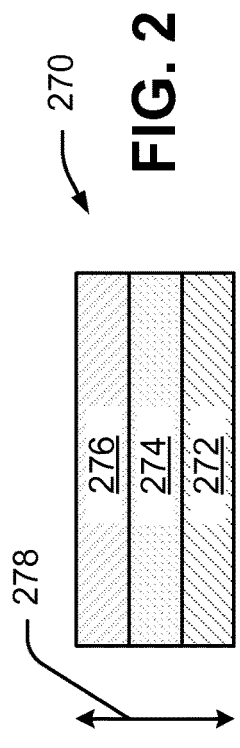

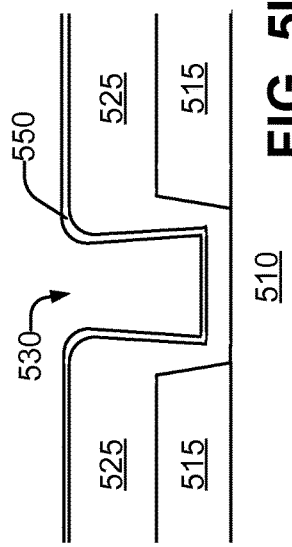
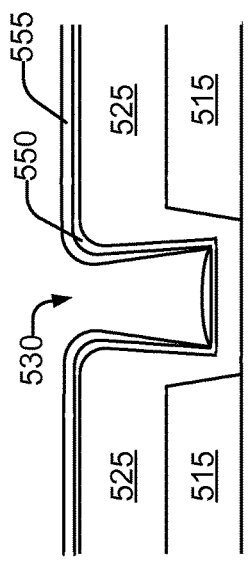
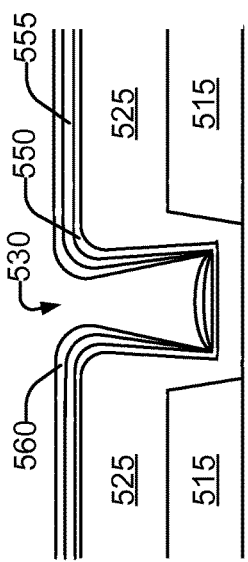
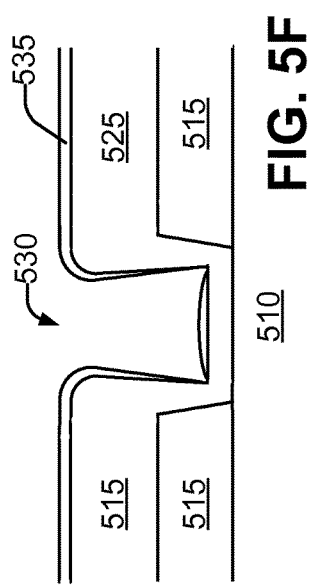
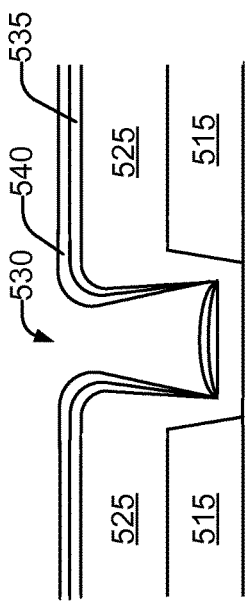
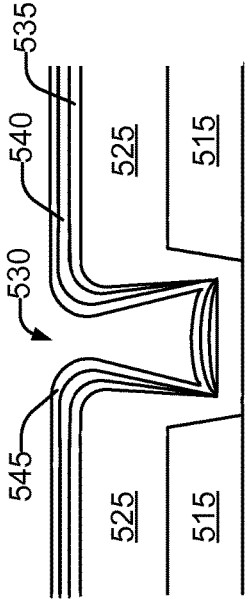

FIG. 6  ← 600

```
┌─────────────────────────────────────────────────────────────┐
│    FORM A FIRST METAL LAYER OVER A SUBSTRATE  605           │
└─────────────────────────────────────────────────────────────┘
                              │
┌─────────────────────────────────────────────────────────────┐
│  FORM A DIELECTRIC LAYER OVER THE FIRST METAL LAYER  610    │
└─────────────────────────────────────────────────────────────┘
                              │
┌─────────────────────────────────────────────────────────────┐
│   REMOVE A PORTION OF THE DIELECTRIC LAYER TO FORM AN       │
│   ORIFICE EXPOSING THE FIRST METAL LAYER  615               │
└─────────────────────────────────────────────────────────────┘
                              │
┌─────────────────────────────────────────────────────────────┐
│  FORM A SECOND METAL LAYER OVER THE DIELECTRIC LAYER        │
│  AND IN THE ORIFICE TO FORM AN ELECTRICAL VIA BETWEEN       │
│  THE TWO METAL LAYERS, THE PARTIALLY-FILLED ORIFICE         │
│  HAVING A DEPTH-TO-WIDTH RATIO OF AT LEAST 0.4  620         │
└─────────────────────────────────────────────────────────────┘
                              │
┌─────────────────────────────────────────────────────────────┐
│  DEPOSIT, BY ATOMIC LEVEL DEPOSITION, AN ALD-DEPOSITED      │
│  LAYER OVER THE SECOND METAL LAYER AND COATING THE          │
│  INTERIOR OF THE VIA  625                                   │
│  ┌───────────────────────────────────────────────────────┐  │
│  │  DEPOSIT AT A TEMPERATURE BETWEEN 150 AND 250         │  │
│  │  DEGREES C USING WATER AS A PRECURSOR OXYGEN          │  │
│  │  SOURCE FOR AN OXIDE, AND HAFNIUM OR ZIRCONIUM AS     │  │
│  │  A METAL SOURCE FOR THE OXIDE  630                    │  │
│  └───────────────────────────────────────────────────────┘  │
│  ┌───────────────────────────────────────────────────────┐  │
│  │  THE ALD LAYER FORMS A SUBSTANTIALLY PINHOLE-FREE     │  │
│  │  COVERING WITHIN THE VIA THAT PREVENTS EROSION OF     │  │
│  │  THE FIRST AND THE SECOND METAL LAYERS  635           │  │
│  └───────────────────────────────────────────────────────┘  │
│  ┌───────────────────────────────────────────────────────┐  │
│  │  APPLY A METAL-CORROSIVE CHEMISTRY TO THE COATED      │  │
│  │  VIA WITHOUT EROSION OF EITHER OF THE FIRST AND       │  │
│  │  SECOND METAL LAYERS  640                             │  │
│  └───────────────────────────────────────────────────────┘  │
│  ┌───────────────────────────────────────────────────────┐  │
│  │  WET ETCH A METAL LAYER OVER THE ALD LAYER USING A    │  │
│  │  METAL-CORROSIVE CHEMISTRY WITHOUT EROSION OF         │  │
│  │  EITHER OF THE FIRST AND SECOND METAL LAYERS  645     │  │
│  └───────────────────────────────────────────────────────┘  │
└─────────────────────────────────────────────────────────────┘
```

ATOMIC LAYER DEPOSITION PASSIVATION FOR VIA

BACKGROUND

Liquid ejection devices are used to eject a variety of liquids from a device onto a substrate. One common type of liquid ejection device is a printhead which controllably ejects drops of a colorant onto a medium in a pattern that produces text and/or images. Such devices are often micro-electro-mechanical systems, or MEMS, devices. It is desirable to fabricate such devices to have high reliability.

BRIEF DESCRIPTION OF THE DRAWINGS

FIG. 1 is a schematic unscaled cross-sectional representation of an electrical via of a liquid ejection device in accordance with an example of the present disclosure.

FIG. 2 is a more detailed schematic unscaled cross-sectional representation in accordance with an example of the present disclosure of a passivation stack of the liquid ejection device of FIG. 1.

FIGS. 5F through 5K are schematic representations of an enlarged portion of a liquid ejection device as fabricated by the steps of the method of FIG. 4 in accordance with an example of the present disclosure.

FIG. 6 is another method of fabricating a liquid ejection device in accordance with an example of the present disclosure.

DETAILED DESCRIPTION

Figure 3:
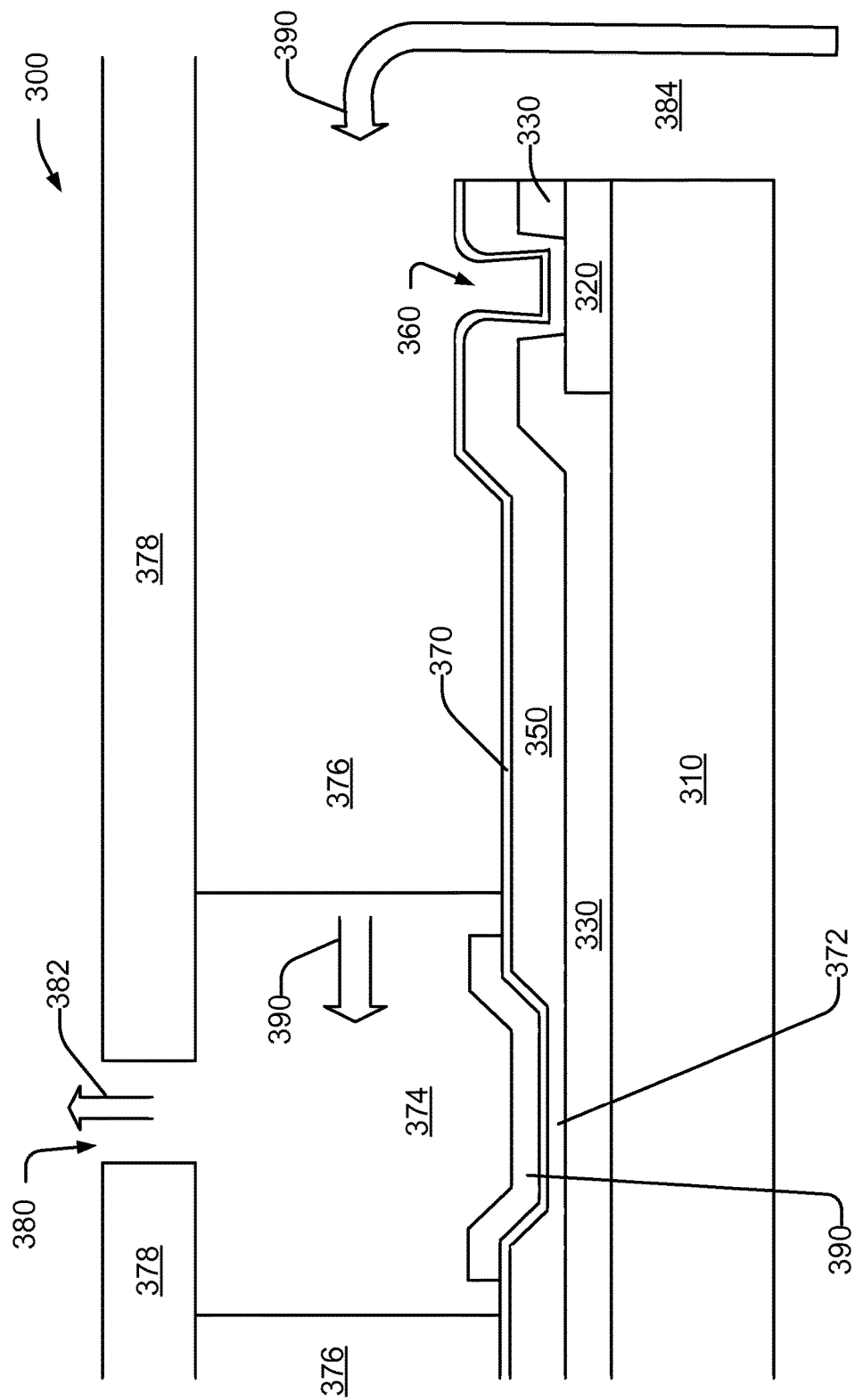
FIG. 3 is a schematic representation of a liquid ejection device including a via and a liquid ejection resistor in accordance with an example of the present disclosure.
Figure 4:
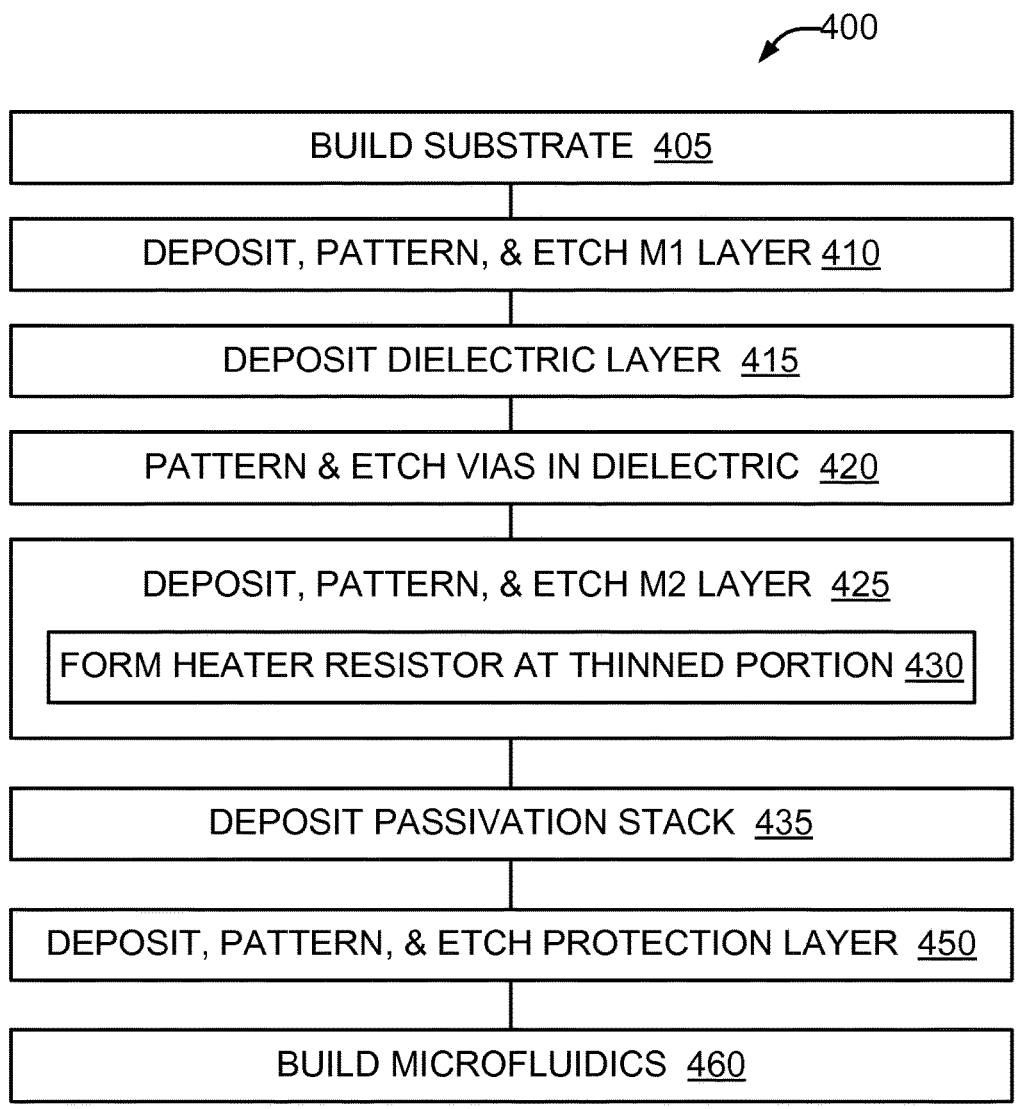
FIG. 4 is a method of fabricating a liquid ejection device in accordance with an example of the present disclosure.

Some MEMS liquid ejection devices utilize thermal inkjet ("TIJ") technology to eject drops of the liquid. In such technology, the liquid to be ejected is routed adjacent to a heater resistor. The resistor is then heated to an extremely high temperature by joule heating, causing a bubble in the heated liquid that in turn causes a drop of the liquid to be ejected, through an orifice, from a chamber surrounding the resistor. A typical device includes up to many thousands of such liquid ejection elements.

Such devices are commonly fabricated by building up the different portions of the device upon a wafer. A microelectronics portion which includes a first set of thin film layers provides logic circuitry for controllable drop ejection, and power circuitry for providing current to the heater resistors. The heater resistors themselves are disposed above the microelectronics portion as part of another set of thin film layers. A fluidics portion disposed above the resistor portion defines chambers and orifices that route and/or channel the liquid to the heater resistors. As defined herein and in the appended claims, a "thin-film" may be broadly understood to mean a layer of material having a thickness is a range from fractions of a nanometer to several microns.

In order to provide to the resistors the current used for joule heating, a number of vias electrically connect a metal layer of the microelectronics portion to a metal layer of the heater resistor portion. Certain chemistries used in the fabrication process, and/or the liquid ejected from the device, can attack, and erode or corrode, the metal used in either or both of the metal layers. Erosion can break the electrical connection and cause the device to fail. In order to prevent such damage to the device, a passivation stack having at least one layer is often formed over the vias. At least one passivation layer is formed from substances which are not attacked by the fab chemistries or the ejection liquid. If the passivation stack provides a pinhole-free coating over the via which prevents the fab chemistries or the ejection liquid from coming into contact with the via, then the via will not be eroded and its electrical connection will be highly reliable.

Some passivation layers are deposited using plasma-enhanced chemical vapor deposition (PECVD). PECVD is a fabrication technique which deposits thin films from a gas state (vapor) to a solid state However, the effectiveness of PECVD in forming a pinhole-free layer is dependent, at least in part, upon the geometries of the surfaces onto which the PECVD thin film is applied.

Vias are formed in the device at locations where two different thin-film metal layers are placed in contact with each other. In most locations, the two layers are separated by a thin-film dielectric (insulative) layer. A via is fabricated by removing a portion of the dielectric layer where the via is to be located, prior to the second metal layer being deposited. When the second metal layer is subsequently deposited, it partially fills the orifice left by the removal of the dielectric material, giving the resulting via a dimple-like surface indentation.

In some devices, the resulting via has a geometric profile, particularly a depth-to-width aspect ratio, for which deposition of one or more passivation layer using PECVD does not provide a pinhole-free covering of all interior surfaces of the via. For such vias, passivation layers deposited by PECVD thin considerably, particularly on the sidewalls of the via and further into the via, which tends to increase the number of pinholes, cracks, and other defects in the passivation layers. Where such defects occur, the chemistries of subsequently applied steps of the fabrication process, and/or the liquid being ejected from the device, could attack and erode one or both of the metal layers of the via. This could damage or destroy the liquid ejection device, degrade its reliability, or shorten its life. It could also reduce the yield of properly working devices from the fab process.

Referring now to the drawings, however, by including in the passivation stack a passivation layer deposited using atomic layer deposition, a substantially pinhole-free covering of all interior surfaces of the via can be achieved which reduces or eliminates erosion damage from the fab chemistries or ejection liquids.

Considering now a liquid ejection device, and with reference to FIG. 1, one example device 100 includes a substrate 110. The substrate 110 includes a wafer, which may be silicon, glass, or another suitable material.

The substrate 110 includes a stack of thin-film microelectronics layers formed on a top surface of the wafer that constitute transistors and other electrical components of logic and power circuitry of the device 100. In one example, the top layer of the microelectronics stack is a dielectric layer.

A conductive first metal ("M1") layer 120 is located over the substrate 110. The M1 layer 120 routes power to substrate components and to the heater resistors. In one example, the M1 layer 120 connects to the power transistors that generate the drive current for the TIJ resistors. The M1 layer 120 may connect to other components as well. In one example, the M1 layer 120 includes a thin layer (100-500 angstroms in thickness) of Ti or TiN underlying a main layer of 0.2 to 1.5 microns of AlCu. In other examples, other conductive materials and/or other thicknesses are used.

A dielectric layer 130 is located over the M1 layer 120. The dielectric layer 130 insulates the substrate 110 from the heater resistor circuitry formed atop the dielectric layer 130. The dielectric layer 130 may be doped or undoped silicon oxides, silicon nitrides, or oxides of Aluminum, Hafnium or other metals. The dielectric layer 130 has a thickness in the range of 0.5 to 2 microns, although in other examples other thicknesses are used.

An orifice 140 is formed through the dielectric layer 130. The orifice 140 extends all the way through the thickness of the dielectric layer 130, to the first metal layer 120. In one example, the orifice is patterned and then etched completely through the dielectric layer 130 to expose a location in the first metal layer 120 at which an electrical connection is to be made. In one example, the orifice 140 is cone-shaped with sidewalls tapered between 0 and −45 degrees relative to an axis 145 orthogonal to a planar surface of the device. (A negative value of sidewall taper indicates an orifice that is narrower at the bottom than the top, while a positive value of sidewall taper indicates an orifice that is wider at the bottom than the top.) The orifice 140 is narrower at the interface of the M1 120 and dielectric 130 layers than at the opposing surface of the dielectric layer 130. The orifice 140 has a width 142 of between 1 micron and 3 microns adjacent the M1 layer 120.

A conductive second metal ("M2") layer 150 is located over the dielectric layer 130. The M2 layer 150 routes current from power components of the microelectronics stack to the TIJ resistor. The M2 layer 150 may connect to other components as well. In one example, the M2 layer 150 has a thickness 152 of 0.9 to 1.5 microns, which includes a thin layer (10 to 50 nanometers in thickness) of Ti underlying a layer of AlCu. In another example, the M2 layer 150 also includes over the AlCu a thin (20 to 300 nanometers in thickness) layer of Ti, Ta, TaAl, W, Ta TaSiN, WSiN, as discussed subsequently with reference to FIG. 3. An M2 layer 150 of thickness 152 is significantly thicker than in other liquid ejection devices. In one example, an M2 layer 150 of greater thickness is related to a reduction in the number of thin-film layers in order to simplify the fabrication process and thus reduce cost. With fewer thin-film layers to carry electrical current, the M2 layer 150 is used to conduct larger amounts of current. The increased thickness lowers the resistance of the M2 layer 150 to allow this increased current to be efficiently conducted without excess voltage drop or generated heat.

The M2 layer 150 partially fills the orifice 140 to form a via 160 which electrically connects the two metal layers 120, 150. In one example, the interior void of the via 160 is cone-shaped with sidewalls tapered between +10 and −45 degrees relative to the axis 145. In one example, the interior void of the via 160 is wider at its closed bottom than at the top surface of the M2 layer 150. The interior void of the via 160 does not extend all the way to the M1 layer 120.

Due to the increased thickness of the M2 layer 150, in one example the via 160 has a depth 162 of between 1 and 3 microns. In one example, the via 160 has a width 164 between 1 and 3 microns. In one example, the via has a depth-to-width aspect ratio of at least 0.4. In another example, the via has a depth-to-width aspect ratio of between 0.4 and 2.0.

A thin-film passivation stack 170 is located over the M2 layer 150. The passivation stack 170 covers all interior surfaces (sidewalls and floor) 166 of the via 160. The passivation stack 170 includes a thin-film layer formed by atomic layer deposition, referred to as an ALD-deposited layer and discussed subsequently in greater detail. The passivation stack 170 is conformal to the surfaces of the via and is substantially pinhole-free.

In one example, the ALD-deposited layer has a thickness between 5 nanometers and 100 nanometers. In another example, the ALD-deposited layer has a thickness of 20 nanometers. In one example, the ALD-deposited layer includes an oxide of hafnium (Hf) or zirconium (Zr). Oxides of these elements are more chemically resistant than those of some other elements, such as aluminum. In another example, the ALD-deposited layer includes a nitride of Hf, Zr, aluminum (Al), silicon (Si) or other elements, The ALD-deposited layer has good dielectric properties and excellent coverage of high aspect ratio geometric features.

Considering now in further detail the passivation stack 170, and with further reference to FIG. 2, a stack 170 includes at least one thin-film layer. Example passivation stack 270 includes multiple layers 272, 274, 276. Layer 272 is the layer in the stack 270 that is closest to the M2 layer 150, and layer 276 is the layer in the stack 270 that is furthest from the M2 layer 150. In one example, the stack 270 has a thickness 278 in the range of 0.1 to 0.5 microns.

At least one of the layers in the stack 270 is an ALD-deposited layer, as discussed heretofore. Where the ALD-deposited layer is an oxide, a number of oxides may be used. One oxide is $HfO_x$, where x in a range of 0.5 to 2. Another oxide is $HfSiyO_x$, where x in a range of 0.5 to 2, and y is in a range of 0 to 1. Yet another oxide is $ZrO_x$, where x is in a range of 0.5 to 2.

Another layer in the stack 270 may be a silicon nitride (SiN) layer formed by PECVD. A SiN thin-film layer provides sufficient dielectric strength. In one example, the SiN layer has a thickness in the range of 50 to 300 nanometers. Yet another layer in the stack 270 may be a silicon carbide (SiC) layer formed by PECVD. A SiC thin-film layer provides chemical resistance. In one example, the SiC layer has a thickness in the range of 10 to 100 nanometers.

A first multiple-layer passivation stack 270 includes a SiN layer 272, a SiC layer 274, and an ALD-deposited layer 276. A second multiple-layer passivation stack 270 includes a SiN layer 272, and an ALD-deposited layer 274; there is no layer 276. A third multiple-layer passivation stack 270 includes an ALD-deposited layer 272, a SiN layer 274, and a SiC layer 276.

Considering now a liquid ejection device including a via and a heater resistor, and with reference to FIG. 3, a device 300 has a substrate 310, M1 layer 320, dielectric layer 330, M2 layer 350, and passivation stack 370. These are the same as or similar to the substrate 110, M1 layer 120, dielectric layer 130, M2 layer 150, and passivation stack 170 of the liquid ejection device 100 (FIG. 1). A fluid ejection element of the device 300 includes a thin-film heater resistor 372 and a chamber 374 defined by a first fluidics layer 376 and a second fluidics layer 378. A nozzle 380 defined by the second fluidics layer 378 allows a drop 382 of a liquid 390 to be ejected from the chamber 374 responsive to joule heating of the resistor 372. The liquid 390 is provided to the chamber through a slot 384 in the device 300, and then through a channel (not shown) in the first fluidics 376 to the chamber 374.

In this example, the heater resistor 372 is formed in a thinned portion of the M2 layer 350. The M2 layer 350 may be thinned by etching away the AlCu prior to deposition of the 20 to 300 nanometer thick coating of Ti, Ta, TaAl, W, Ta TaSiN, or WSiN. This coating forms the heater resistor 372. During a drop ejection operation, current in the M2 layer 350 controllably flowing through the smaller cross-sectional area of the resistor 372 produces the joule heat used to vaporize and eject liquid drops. The M2 layer segment 350 connects to the power circuitry on the substrate 110 through vias (for simplicity, one via 360 is illustrated).

The passivation stack 370 covers both the via 360 and the heater resistor 372. Doing so allows the device 300 to be constructed using fewer layers. Fewer layers corresponds to fewer fabrication process steps, which advantageously reduces time and cost of fabrication, among other benefits. However, the via 360 and resistor 372 have competing interests regarding the thickness of the passivation stack 370. The thicker the passivation stack 370, the more resistant the via 360 is to fab chemistries and liquids. But a thicker passivation stack 370 over the heater resistor 372 degrades energy consumption and throughput of liquid ejection. This is because the thicker the passivation stack 370, the more energy has to be put into the heater resistor 372 to generate the bubble for drop ejection. In addition, the faster the cycle time of drop ejection, the more heat builds up in the printhead, eventually reaching a sufficiently high temperature at which thermal runaway occurs and prevents further drop ejection until the temperature is reduced. By using an ALD-deposited layer in the passivation stack 270 (FIG. 2), these competing interests can be satisfied with a passivation stack 370 that has a thickness in the range of 0.1 to 0.5 microns A protection layer 390 is located over the passivation stack 370. The protection layer 390 protects the heater resistor 372 both from chemical attack by the liquid being ejected, and from the mechanical forces that occur during the heating and vaporization of the liquid, the ejection of the drop, and the subsequent collapse of the bubble in the liquid. The protection layer 390 may have a thickness in the range of 50 to 1000 nanometers. In one examples the protection layer 390 is patterned and etched such that, following etching, the protection layer 390 remains over the heater resistor 372, but is removed over the via 360. In one example, there are no additional thin-film layers disposed between the via 360 and the first fluidics 376. Where the protection layer 390 is removed from over the via 360, or where there is no additional thin-film layers disposed between the via 360 and the first fluidics 376, it is possible in some fluidics configurations for the liquid to come into contact with the via 360. In such configurations, the passivation stack 370 protects the via 360 from erosion by liquids that may be corrosive to the metals of the M1 and M2 layers 320, 350.

Figure 5D:
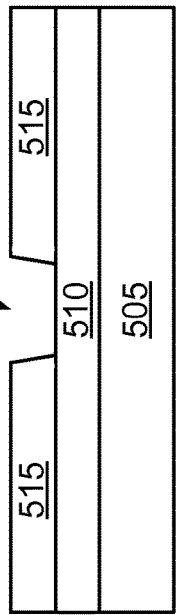
FIGS. 5A through 5E are schematic representations of a liquid ejection device as fabricated by the steps of the method of FIG. 4 in accordance with an example of the present disclosure.
Figure 5E:
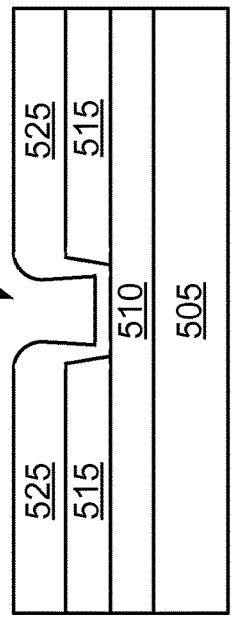
Figure 5A:
Figure 5B:
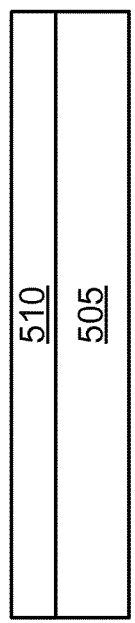
Figure 5C:
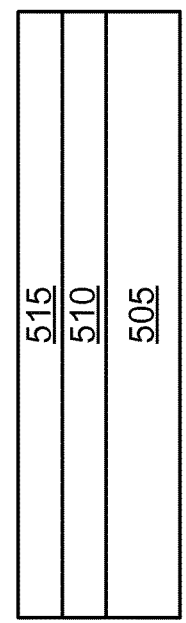

Considering now a method of fabricating a liquid ejection device, and with reference to FIGS. 4 and 5A-5K, a method 400 begins, at 405, by building a substrate 505 (FIG. 5A). As discussed heretofore, the substrate includes thin-film layers for logic and power circuitry.

At 410, a thin-film M1 layer 510 (FIG. 5B) is deposited over the substrate 505, and then patterned and etched. The deposition may be performed using physical vapor deposition (PVD), which is a vacuum deposition technique that condenses a vaporized form of the film material onto a surface. The PVD deposition may be performed using sputtering, which ejects the film material from a target onto the surface. The deposition may alternatively be performed using evaporation. The patterning is done with a photolithography operation. Photolithography includes depositing a photoresist coating (by spin coating, curtain coating, or dry film lamination techniques); baking to drive off solvents and/or reflow the resist; exposing the resist using a photomask and a light source to selectively expose regions of the resist to light so as to make them soluble in a chemical developer; and applying the developer to the device (by spray or immersion) to remove the soluble regions. In the regions where the resist has been removed, an appropriate etching operation can remove the underlying layers. In one example, the M1 layer 320 (FIG. 3) is removed by etching in the vicinity of the heater resistor 372 (FIG. 3). The M1 layer may be etched using a dry plasma process.

At 415, a thin-film dielectric layer 515 (FIG. 5C) is deposited over the M1 layer 510. In one example, the dielectric layer 515 is deposited by PECVD. In other examples, the dielectric layer 515 is deposited by PVD/sputtering, or by ALD. The dielectric layer 515 insulates the M1 layer 510 and the substrate 505 from layers subsequent deposited above the dielectric layer 515.

At 420, at least one orifice 520 (FIG. 5D) for a via is patterned and etched in the dielectric layer 515. The patterns are defined using photolithography. A dry (plasma) etch process then removes the dielectric layer 515 according to the photolithographic pattern in order to form the orifices 520.

At 425, a thin-film M2 layer 525 (FIG. 5E) is deposited over the dielectric layer 515, and then patterned and etched. The deposition may be performed using the same techniques used for the M1 layer 320. The M2 layer 525 partially fills the orifice 520 and forms an electrical connection to the M1 layer 510, resulting in a modified orifice 530 which constitutes the via. A pattern in the M2 layer 525 is then created with a photolithography operation, and the M2 layer 525 is etched according to the photolithographic pattern using a dry plasma operation.

In one example, block 425 includes, at 430, forming a heater resistor 372 (FIG. 3) at a thinned portion of the M2 layer. The M2 layer may be thinned by completely etching away the AlCu prior to deposition of the Ti, Ta, TaAl, W, Ta TaSiN, or WSiN coating. In the thinned region, this coating forms the heater resistor 372. In other regions of the M2 layer, this coating is non-functional because current is carried by the AlCu.

At 435, a thin-film passivation stack is deposited over the M2 layer 525. The passivation stack forms a conformal, substantially pinhole-free coating on all interior surfaces of the modified orifice 530, forming the completed via. In some examples, the depth-to-width aspect ratio of the completed via ranges from 0.4 to 2.0.

In examples, the passivation stack includes multiple thin-film layers. Some layers of a stack may be deposited by PECVD. At least one of the layers in each stack is an ALD-deposited layer deposited by atomic layer deposition. ALD sequentially uses a gas phase process for each of two precursors, which react with the surface of the underlying material one at a time. Within a reaction chamber, and at a certain temperature, gas of a first precursor is flowed over the surface to be coated so that a monolayer of the gas is adsorbed to the surface; this is the atomic layer. The chamber is then purged, and the second precursor is pulsed, which reacts with the first precursor to create another layer on the surface. The chamber is again purged. This process is repeated to build up the film to the desired thickness. The sequence of deposited monolayers produces the substantially pinhole-free coating. In one example, the first precursor is the metal (Hafnium or Zirconium), and the second precursor is the oxidizer. The oxidizer reacts with the monolayer of metal and forms a monolayer of the metal oxide. In some examples, the metal is Hafnium (Hf), and the source is TEMAHf, TDMAHf, or HfCl4. In some examples, the oxidizer is water.

In one example, and with reference to FIGS. 5F-5H, the ALD-deposited layer is the last layer deposited in the passivation stack. A first layer 535 (FIG. 5F) is deposited by PECVD. In one example, the first layer 535 is SiN. However, due to the geometry (particularly the depth-to-width aspect ratio) of the modified orifice 530, the layer 535 does not fully cover all the interior surfaces of the orifice 530. In particular, the layer 535 thins considerable along the sidewalls further into the orifice 530. The thinner the layer, the more pinhole defects arise. In some examples, a second layer 540 (FIG. 5G), which may be SiC, is deposited by PECVD over the first layer 535, but the two layers 535, 540 collectively do not fully cover all the interior surfaces of the orifice 530. An ALD-deposited layer 545 (FIG. 5H) is then deposited by ALD over the second layer 540. The ALD-deposited layer 545 conformally coats all interior surfaces of the orifice 530, over the second layer 540 and first layer 535, producing the substantially pinhole-free covering.

In another example, and with reference to FIGS. 5I-5K, an ALD-deposited layer is the first layer deposited in the passivation stack. The ALD-deposited layer 550 (FIG. 5I) is deposited by ALD, and conformally coats all interior surfaces of the orifice 530 producing a substantially pinhole-free covering. Next, a second layer 555 (FIG. 5J), which in one example is SiN, is deposited by PECVD over the ALD-deposited layer 550. Although the second layer 555 thins considerable along the sidewalls further into the orifice 530, the underlying ALD-deposited layer 550 maintains the substantially pinhole-free covering on all interior surfaces of the orifice 530. In some examples, a third layer 560 (FIG. 5K), which may be SiC, is deposited by PECVD over the second layer 555. The underlying ALD-deposited layer 550 maintains the substantially pinhole-free covering on all interior surfaces of the orifice 530.

In some examples, the passivation stack deposited at 435 is subsequently patterned and etched. This may be done using dry etching.

At 450, a protection layer is deposited over the passivation stack, and then patterned and etched. The example of FIG. 3 illustrates protection layer 390 deposited over the passivation stack 370. One purpose of the protection layer is to protect the heater resistor 372 from the impact of the collapsing liquid bubble (cavitation). The protection layer may be Ta, or another metal such as Ti, W, TaAl, Au, or Pt, and may be deposited by sputtering or evaporation. In an example, the thickness of the protection layer is 1 micron or less.

In some liquid ejection devices, the protection layer may be etched off in certain places, including over the via 360 (FIG. 3). The protection layer can be etched using dry etching or wet etching. Wet etching can be advantageous for cost reasons, such as a reduction in etch time. One wet etch chemistry used to etch Ta is a mixture of hydrofluoric acid:nitric acid:acetic acid (HF:HNO3:CH3COOH) whose ratios can vary. However, this chemistry is aggressively metal-corrosive; in addition to Ta, it also etches Si, Si3N4, various resistor materials, and also AlCu used in the M1 and M2 layers 320, 350A-B. Materials not etched by this chemistry are SiC and HfO (or ZrO). The substantially pinhole-free ALD-deposited layer in the passivation stack 370 prevents damage to the via 360 by preventing the etching chemistries from coming into contact with the M1 and M2 layers 320, 350A-B. Chemistries for etching the other metals usable in the protection layer have similar characteristics, and the passivation stack 370 protects the via 360 where these other metals are used for the protection layer.

At 460, the microfluidics components, such as first fluidics 376 and second fluidics 376 (FIG. 3) are fabricated on top of the various thin films of the liquid ejection device. In some examples, some or all of the fluidics 376, 378 are formed of photoimageable SU8 epoxy.

Testing was done to determine the resistance to aggressive metal-corroding chemistries of various passivation stack architectures and ALD process conditions used in a via, as indicated in Table I. The term "Damage" includes any visual attack or etching of any of the via material, including the passivation stack or the underlying M1 and M2 layers. The quantity "% Damage" indicates the percentage of 73 via samples fabricated with the specified architecture and ALD process conditions that show damage when inspected by SEM cross section.

TABLE I

Chemistry Resistance of Passivation Stack

| # | Passivation Stack Architecture | ALD Temp | Etch Time | % Damage |
|---|---|---|---|---|
| 1 | 80 nm Sin + 70 nm SiC | — | 6 min | 100% |
| 2 | 20 nm Hf/O$_3$ + 60 nm SiN + 70 nm SiC | 150 C. | 6 min | 80% |
| 3 | 20 nm Hf/H$_2$O + 60 nm SiN + 70 nm SiC | 150 C. | 13 min | 0% |
| 4 | 20 nm Hf/O$_3$ + 60 nm SiN + 70 nm SiC | 250 C. | 13 min | 60% |
| 5 | 20 nm Hf/H$_2$O + 60 nm SiN + 70 nm SiC | 250 C. | 13 min | 0% |

Architecture #1 had two layers, neither of them an ALD oxide layer. A first Sin layer, 80 nanometers in thickness, was formed by PECVD. A third SiC layer, 70 nanometers in thickness, was formed by PECVD. Etching architecture #1 with a metal-corrosive chemistry for 6 minutes resulted in damage to 100% of the via samples.

Architecture #2 had three layers. A first oxide layer of HfO, 20 nanometers in thickness, was formed by ALD at a temperature of 150 degrees C., using ozone (O$_3$) as the oxidizer. A second Sin layer, 60 nanometers in thickness, was formed by PECVD. A third SiC layer, 70 nanometers in thickness, was formed by PECVD. Etching architecture #2 with a metal-corrosive chemistry for 6 minutes resulted in damage to 80% of the via samples.

Architecture #3 had three layers. A first oxide layer of HfO, 20 nanometers in thickness, was formed by ALD at a temperature of 150 degrees C., using water (H$_2$O) as the oxidizer. A second Sin layer, 60 nanometers in thickness, was formed by PECVD. A third SiC layer, 70 nanometers in thickness, was formed by PECVD. Etching architecture #3 with a metal-corrosive chemistry for 13 minutes resulted in no damage to any of the via samples.

Architecture #4 had three layers. A first oxide layer of HfO, 20 nanometers in thickness, was formed by ALD at a temperature of 250 degrees C., using ozone (O$_3$) as the oxidizer. A second Sin layer, 60 nanometers in thickness, was formed by PECVD. A third SiC layer, 70 nanometers in thickness, was formed by PECVD. Etching architecture #4 with a metal-corrosive chemistry for 13 minutes resulted in damage to 60% of the via samples.

Architecture #5 had three layers. A first oxide layer of HfO, 20 nanometers in thickness, was formed by ALD at a temperature of 250 degrees C., using water (H$_2$O) as the oxidizer. A second Sin layer, 60 nanometers in thickness, was formed by PECVD. A third SiC layer, 70 nanometers in thickness, was formed by PECVD. Etching architecture #5 with a metal-corrosive chemistry for 13 minutes resulted in no damage to any of the via samples.

The test results thus indicate that using an ALD layer in the passivation stack significantly improves chemical resistance of underlying metal layers. The substantially pinhole-free passivation stack inhibits the aggressive chemistry from attacking the metal layers of the vias. In addition, the test results indicate that water ($H_2O$) is a superior oxidizer for the HfO film than ozone ($O_3$). Total protection of the vias for an etch time up to 13 minutes was provided at both an ALD temperature of 150 degrees C. and 250 degrees C. for architectures that included an ALD layer formed using water as the oxygen precursor.

Considering now another method of fabricating a liquid ejection device, and with reference to FIG. 6, a method 600 begins, at 605, by forming a first metal layer over a substrate. At 610, a dielectric layer is formed over the first metal layer. At 615, a portion of the dielectric layer is removed to form an orifice exposing the first metal layer. At 620, a second metal layer is formed over the dielectric layer and in the orifice in order to form an electrical via between the two metal layers, the partially-filled orifice having a depth-to-width ratio of at least 0.4. At 625, an oxide or nitride ALD-deposited layer is deposited by atomic layer deposition over the second metal layer and coating the interior of the via. In some examples, at 630, the deposition is performed at a temperature between 150 and 250 degrees C. using water as a precursor oxygen source for an oxide, and hafnium or zirconium as a metal source for the oxide. In some examples, at 635, the ALD-deposited layer forms a substantially pinhole-free covering within the via that prevents erosion of the first and the second metal layers. In some examples, at 640, a metal-corrosive chemistry is applied to the coated via without erosion of either of the first and second metal layers. In some examples, at 645, a metal layer over the ALD-deposited layer is wet-etched using a metal-corrosive chemistry without erosion of either of the first and second metal layers. The metal layer may be directly over the ALD-deposited layer, or there may be intermediate layers between the metal layer and the ALD-deposited layer.

From the foregoing it will be appreciated that the liquid ejection device, printhead, and methods provided by the present disclosure represent a significant advance in the art. Although several specific examples have been described and illustrated, the disclosure is not limited to the specific methods, forms, or arrangements of parts so described and illustrated. This description should be understood to include all novel and non-obvious combinations of elements described herein, and claims may be presented in this or a later application to any novel and non-obvious combination of these elements. Terms of orientation and relative position (such as "top," "bottom," "side," and the like) are not intended to require a particular orientation of any element or assembly, and are used only for convenience of illustration and description. The foregoing examples are illustrative, and no single feature or element is essential to all possible combinations that may be claimed in this or a later application. Unless otherwise specified, steps of a method claim need not be performed in the order specified. Similarly, blocks in diagrams or numbers (such as (1), (2), etc.) should not be construed as steps that must proceed in a particular order. Additional blocks/steps may be added, some blocks/steps removed, or the order of the blocks/steps altered and still be within the scope of the disclosed examples. Further, methods or steps discussed within different figures can be added to or exchanged with methods or steps in other figures. Further yet, specific numerical data values (such as specific quantities, numbers, categories, etc.) or other specific information should be interpreted as illustrative for discussing the examples. Such specific information is not provided to limit examples. The disclosure is not limited to the above-described implementations, but instead is defined by the appended claims in light of their full scope of equivalents. Where the claims recite "a" or "a first" element of the equivalent thereof, such claims should be understood to include incorporation of one or more such elements, neither requiring nor excluding two or more such elements. Where the claims recite "having", the term should be understood to mean "comprising".

What is claimed is:

1. A liquid ejection device, comprising:
   a first metal layer over a substrate;
   a dielectric layer over the first metal layer;
   an orifice through the dielectric layer to the first metal layer;
   a second metal layer over the dielectric layer and partially filling the orifice to form a via to electrical connect the two metal layers, the via having a depth-to-width ratio of at least 0.4; and
   a passivation stack covering the second metal layer including all interior surfaces of the via, the stack including an ALD-deposited layer formed by atomic layer deposition.

2. The device of claim 1, wherein the second metal layer has a thickness, above the dielectric layer, of at least 0.9 microns.

3. The device of claim 1, wherein the via has a depth of one to three microns and a width of one to three microns.

4. The device of claim 1, wherein the passivation stack has a thickness in the range of 0.1 to 0.5 microns.

5. The device of claim 1, wherein the ALD-deposited layer has a thickness between 5 nanometers and 100 nanometers.

6. The device of claim 1, wherein the passivation stack includes a silicon nitride layer formed by plasma-enhanced chemical vapor deposition and having a thickness between 50 nanometers and 300 nanometers.

7. The device of claim 5, wherein the passivation stack includes a silicon carbide layer formed by plasma-enhanced chemical vapor deposition and having a thickness between 10 nanometers and 100 nanometers.

8. The device of claim 1, wherein the ALD-deposited layer is the layer in the passivation stack closest to the second metal layer.

9. The device of claim 1, wherein the ALD-deposited layer is the layer in the passivation stack furthest from the second metal layer.

10. A method of fabricating the liquid ejection device of claim 1, comprising:
    forming the first metal layer over the substrate;
    forming the dielectric layer over the first metal layer;
    removing a portion of the dielectric layer to form the orifice exposing the first metal layer;
    forming the second metal layer over the dielectric layer and in the orifice to form the via connecting the two metal layers, the via having the depth-to-width ratio of at least 0.4; and
    depositing, by atomic layer deposition, the ALD-deposited layer over the second metal layer, the ALD-deposited layercoating the interior of the via.

11. The method of claim 10, comprising:
wet etching a metal layer over the ALD-deposited layer using a metal-corrosive chemistry without damage either of the first and the second metal layers.

12. The method of claim 10, wherein the ALD-deposited layer forms a substantially pinhole-free covering within the via that inhibits erosion of the first and the second metal layers by metal-corrosive chemistries in contact with the via.

13. The method of claim 10, wherein the ALD-deposited layer is an oxide, and wherein the depositing by atomic layer deposition is performed at a temperature between 150 and 250 degrees C. using water as a precursor oxygen source for the oxide and hafnium (Hf) or zirconium (Zr) as a metal source for the oxide.

14. A printhead, comprising:
a via electrically connecting a first and a second metal layer separated by a dielectric, the via having an orifice in the second metal layer, the orifice having a depth-to-width ratio of at least 0.4; and
a substantially pinhole-free thin-film passivation stack covering the second metal layer including all interior surfaces of the orifice, the stack having an ALD-deposited layer formed by atomic layer deposition and an insulative layer formed by plasma enhanced chemical vapor deposition.

15. A printhead, comprising:
a via electrically connecting a first and a second metal layer separated by a dielectric, the via having an orifice in the dielectric layer, the orifice having a depth-to-width ratio of at least 0.4; and
a passivation stack covering the second metal layer including all interior surfaces of the orifice, the passivation stack having an ALD-deposited layer formed by atomic layer deposition and an insulative layer;
a thin-film resistor over and electrically connected to the second metal layer; and
a microfluidic arrangement adjacent the resistor to eject fluid from the printhead responsive to joule heating of the resistor responsive to current in the first metal layer supplied to the second layer through the via.

16. The printhead of claim 15, wherein the second metal layer has a thickness, above the dielectric layer, of at least 0.9 microns.

17. The printhead of claim 15, wherein the passivation stack has a thickness in the range of 0.1 to 0.5 microns.

18. The printhead of claim 15, wherein the ALD-deposited layer has a thickness between 5 nanometers and 100 nanometers.

19. The printhead of claim 15, wherein the passivation stack includes a silicon nitride layer formed by plasma-enhanced chemical vapor deposition and having a thickness between 50 nanometers and 300 nanometers.

20. The printhead of claim 15, wherein the passivation stack includes a silicon carbide layer formed by plasma-enhanced chemical vapor deposition and having a thickness between 10 nanometers and 100 nanometers.

* * * * *